United States Patent
He

(10) Patent No.: US 6,903,431 B2
(45) Date of Patent: Jun. 7, 2005

(54) SUBSTRATE METHOD AND APPARATUS

(75) Inventor: Jianggi He, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/447,495

(22) Filed: May 28, 2003

(65) Prior Publication Data

US 2004/0238938 A1 Dec. 2, 2004

(51) Int. Cl.[7] ............................................. H01L 29/82
(52) U.S. Cl. ........................................ 257/426; 257/774
(58) Field of Search ................................. 257/426, 907, 257/774, E21.577, E21.585, E21.586, E23.011, E23.067, E23.174

(56) References Cited

U.S. PATENT DOCUMENTS

| | | | | |
|---|---|---|---|---|
| 5,208,068 A | * | 5/1993 | Davis et al. | 427/96.9 |
| 6,239,485 B1 | * | 5/2001 | Peters et al. | 257/700 |
| 2004/0110382 A1 | * | 6/2004 | Chakravorty | 438/694 |

FOREIGN PATENT DOCUMENTS

| | | | | |
|---|---|---|---|---|
| JP | 2000164765 A | * | 6/2000 | H01L/23/12 |

OTHER PUBLICATIONS

Brooks, D., "Differential Signals: The Differential Difference!," CMP Media, UltraCAD Design, Inc., May 2001, 2 pgs.

NG, E. et al., "Low Power Gbit/sec Low Voltage Differential Signaling I/O System," Electrical Engineering and Computer Science, University of California, Berkeley, 7 pgs.

Parker, K., "A Signaling Primer," Apr. 24, 2004, 8 pgs.

"Inside Differential Signals," Cadence community Educational Series, Dec. 2001, 3 pgs.

* cited by examiner

*Primary Examiner*—Paul E Brock, II
(74) *Attorney, Agent, or Firm*—Schwabe, Williamson & Wyatt, P.C.

(57) ABSTRACT

This invention relates to an apparatus and methods for reducing the impedance mismatch problem encountered by differential signaling in conductive core substrates, while maintaining adherence to the common mode noise assumption. Specifically, the conductive paths that traverse through the conductive core are separated by a nonconductive material which minimize impedance and interruption of the signal coupling.

21 Claims, 3 Drawing Sheets

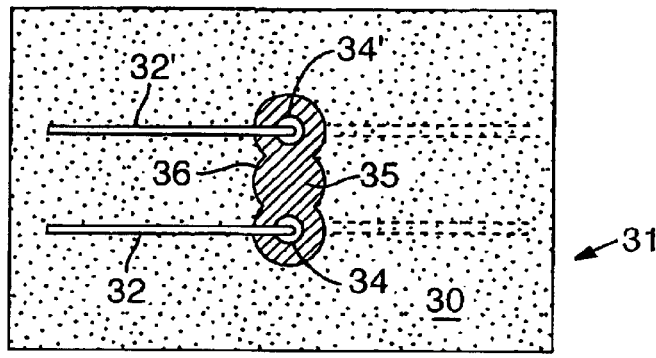
FIG. 1
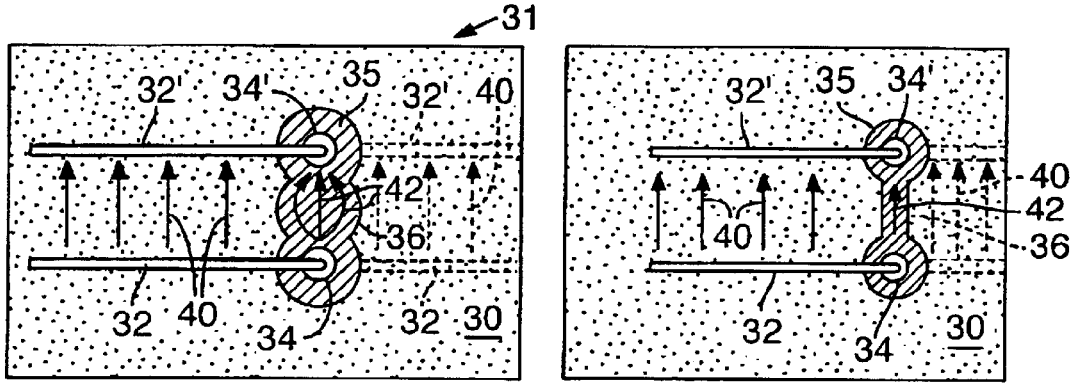
FIG. 2
FIG. 4
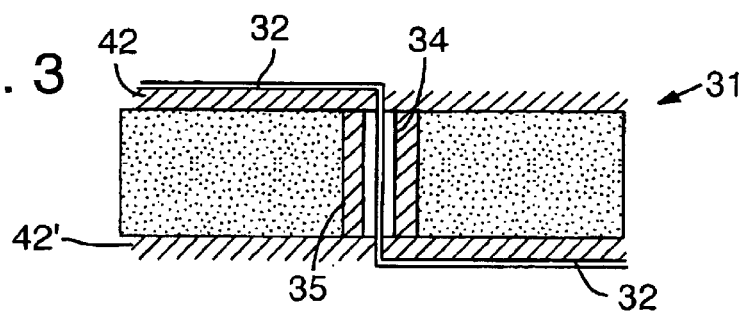
FIG. 3

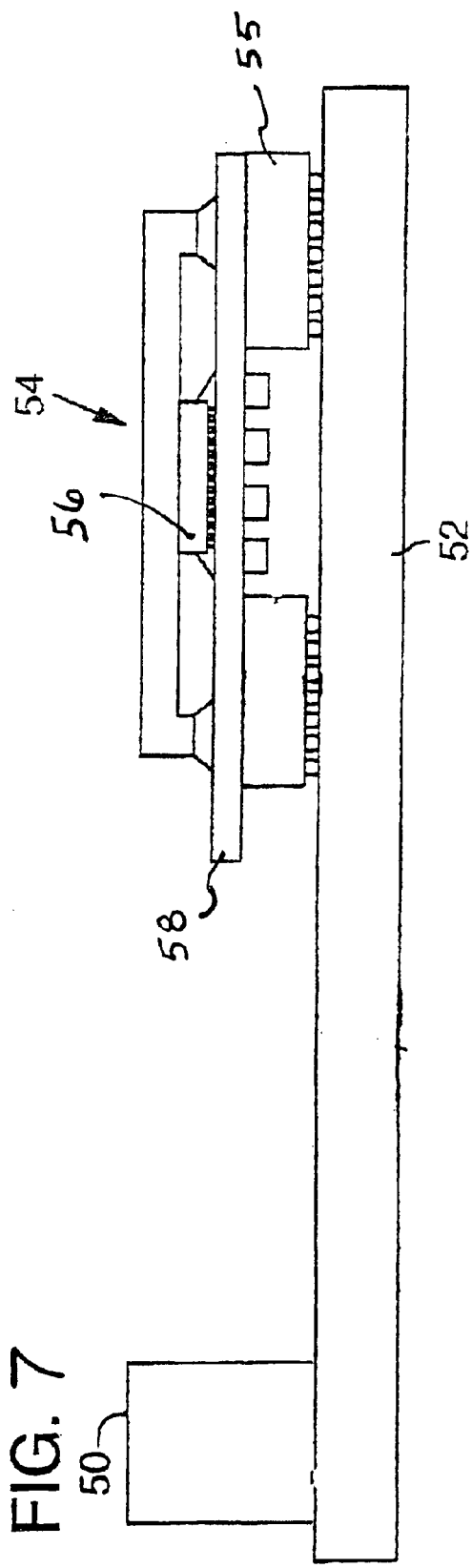

SUBSTRATE METHOD AND APPARATUS

FIELD OF THE INVENTION

This invention pertains to conductive core substrates, and particularly to apparatus and methods to reduce impedance mismatch issues with differential signaling in conductive core substrates, while maintaining adherence to the common mode noise assumption.

BACKGROUND OF INVENTION

Trends in microelectronic devices are toward increasing miniaturization, circuit density, operating speeds and switching rates. These trends have directly impacted the complexity associated with the design and manufacture of dies, microelectronic devices, which include the microelectronic die and a substrate, microelectronic packages, which include the microelectronic device, as well as computing devices in general. Examples of computing devices include, but are not limited to, servers, personal computers and "special" purpose computing devices. Personal computers may have form factors, such as desktop, laptop, tablet, and the like. "Special" purpose computing devices may include set top boxes, personal digital assistants, wireless phones, and the like.

Accordingly, substrates, including but not limited to those used in microelectronic packages, have also evolved to enable the microelectronic devices to operate at higher speeds and efficiencies. Substrates include, but are not limited to, interposers, printed circuit boards, motherboards, and the like. One such advancement includes the use of conductive core substrates. One example of a conductive core substrate is a metal core substrate, which comprises a single or multiple metal layers encapsulated in a dielectric material. Metals used in metal core packages include, but are not limited to, copper, molybdenum, copper-Invar-copper and other conductive metals. Metal core substrates have become more prevalent due to their low coefficient of thermal expansion (CTE), low inductance, low resistance, high thermal conductivity and lower cost. The metal core also provides structural support to allow the substrate to carry large and heavy components, and to function in environments where shock, vibration, heat, and survivability are a factor.

Another advancement in substrate technology is the incorporation of differential signaling for the transmission of signals/data to and from a microelectronic die. Differential signaling provides a pair of conductive pathways, in one example, also known as traces, formed within and/or on the substrate to conduct the signal. A fist trace typically carries a positive signal, and a second trace carries a signal that is of equal magnitude, but opposite in phase, i.e. a negative signal. Differential signaling provides a number of benefits, including, but not limited to, lower voltage swings, faster switching rates, reduced power consumption, and reduced electromagnetic interference (EMI). Differential signals carried on the first and second traces are also less sensitive to electrical cross talk or interference, and have better overall noise immunity. For example, noise generated by spurious conditions within the microelectronic package or noise generated from an outside source adds to both signals equally. Thus, when the receiver subtracts the noise in the negative signal from the noise in the positive signal, the noise in each signal trace effectively cancels out. This is known in the art as "common mode noise assumption."

With differential signaling, it is important to design the trace pairs in such a way that the characteristic impedance of the first and second trace is equal and constant. Substrate design configurations often include the first trace and the second trace to traverse from one substrate layer to another, which can require passing through the conductive core.

FIG. 5 is a top view of a portion of a current metal core substrate 10 comprising a first trace 12, adapted to carry a positive signal, that runs generally parallel to a second trace 12', adapted to carry a signal having an equal but opposite magnitude. First and second traces 12, 12' traverse a layer of the substrate. The first trace 12 interconnects with a first via 14 that extends through the metal core 10. Second trace 12' interconnects with a second via 14' also extending through the metal core 10. First and second vias 14, 14' allow the differential signals to pass through metal core 10 to a different layer.

FIG. 6 is a side view of the metal core 10 in accordance with FIG. 4, showing the path of the first trace 12 from a first side of metal core 10 to a second side of metal core 10. Trace 12 traverses a layer 15 above the metal core 10, passes through metal core 10 using the path formed by a via 14 extending through the metal core 10, such as a plated through hole (PTH), and then again traverses a different layer 15' on the second side of metal core 10. Though not shown, second trace 12' traverses a generally parallel but separate path as that of first trace 12.

FIG. 5 also shows the electric field distribution between the first and second trace 12, 12'. While traversing the same layer, there is unimpeded signal coupling between the signal carried on trace 12 and the signal carried on trace 12', as shown by arrows 16 representing electric field lines. This is an optimal distribution, as there is little or no impedance mismatch since there is no conductive obstruction between first and second traces 12, 12' to block the signal coupling. This holds true regardless of which layer is being traversed.

A problem arises, however, when the first and second traces 12, 12' traverse through the metal core 10. A portion 18 of the metal core 10 (designated by dashed lines) separates the first and second vias 14, 14', which impedes the signal coupling of the first and second traces 12, 12'. This results in several undesirable effects. First, as shown by electric field lines 20, there is impedance mismatch between the signals as they traverse first and second vias 14, 14'. Second, the common mode noise assumption no longer applies because the signals blocked by portion 18 of metal core 10 resulting in different degrees of noise couple to first and second traces 12, 12' in differing amounts. These effects result in a significant degradation of the signal integrity, which impairs performance.

Accordingly, there is a need for apparatus and methods to employ differential signaling in conductive core substrates, which maintain matched impedance between the differential signal traces while traversing through the conductive core, while also maintaining the common mode noise assumption.

BRIEF DESCRIPTION OF DRAWINGS

FIGS. 1 and 2 are top views of a conductive core substrates including differential signal traces in accordance with one embodiment of the present invention;

FIG. 3 is a side cross sectional view of the conductive core substrate shown in FIGS. 1 and 2.

FIG. 4 is a top view of a conductive core substrates including differential signal traces in accordance with another embodiment of the present invention;

FIG. 7 is a side view of a microelectronic package in accordance with one embodiment of the present invention.

DESCRIPTION

Figure 5:
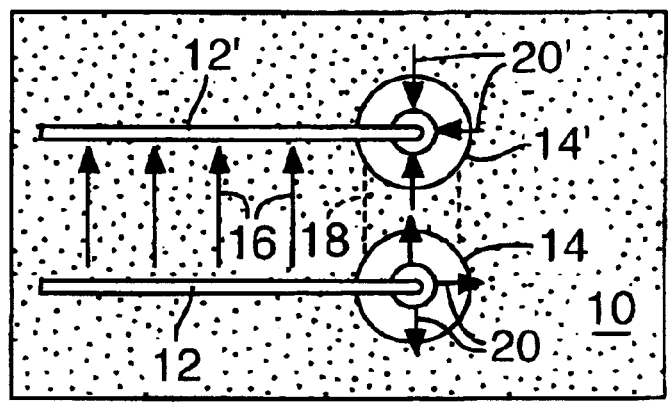
FIG. 5 is a top view of a prior art metal core substrate.
Figure 6:
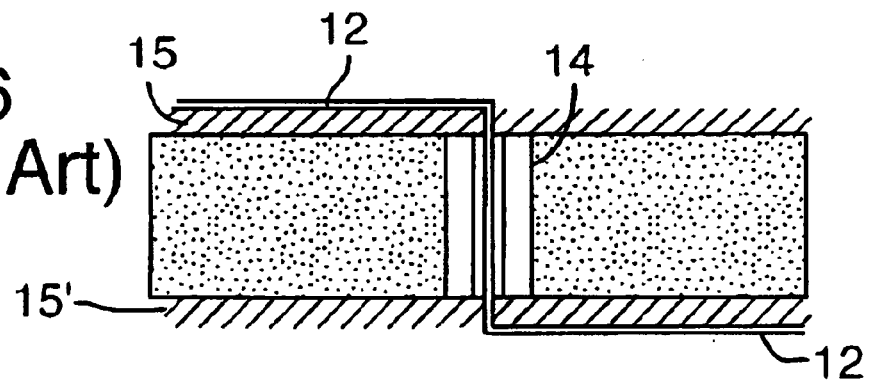
FIG. 6 is a side cross sectional view of the embodiment of the metal core substrate of FIG. 5.

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

FIG. 7 illustrates a side view of a microelectronic package in accordance with one embodiment of the present invention. A microelectronic package 54 may be coupled to a substrate, such as a printed circuit board 52, via socket connection 55. Microelectronic package 54 may include a die 56 electrically coupled to substrate, such as an interposer 58. Microelectronic package 54 may also be electrically coupled to power source 50.

FIG. 1 is a top view of a portion of a substrate 31 having a conductive core 30 with conductive differential signal first and second traces 32, 32' traversing substrate layers above and below conductive core 30, as well as through conductive core 30. Conductive core 30 can be any conductive material, but it has been found that conductive metal, including but not limited to copper, molybdenum, copper-invar-copper, are preferred. Conductive core 30 has an aperture 36 extending from the first side to the opposite second side. The aperture 36 contains a first conductive path 34 and a second conductive path 34', which are electrically insulated from each other and electrically insulated from the conductive core 30. First and second conductive paths 34, 34' are spaced apart, such that there is no conductive core existing in the aperture between first and second conductive paths 34, 34'.

As shown in FIG. 3, first trace 32 traverse a first layer 42 on a first side of conductive core 30 and can electrically interconnect with first conductive path 34 in aperture 36. The signal carried on first trace 32 then can traverse from the first side of conductive core 30 to the second side of conductive core 30 by way of the first conductive path 34. Once having traversed conductive core 30, first trace 32 then traverses a second layer 42'. Though not shown in the cross sectional view of FIG. 3, second trace 34' also traverses first layer 42, generally parallel to first trace 32', passes through conductive core 30 through conductive path 34' of aperture 36, and then traverses second layer 42'.

By having the first and second conductive paths 34,34' electrically insulated from each other and disposed in a spaced apart relationship within aperture 36, the impedance remains substantially equal between the first and second conductive paths 34, 34' as there is no conductive obstructions there between, which results in more optimal signal coupling. It can be appreciated by one skilled in the art that the first layer 42 and second layer 42', for which conductive core 30 lies between, need not be directly adjacent to the conductive core.

Conductive paths 34, 34' can be vias, plated through holes, or any other path that will allow a signal to traverse from either first trace 32 or second trace 32' through conductive core 30 through aperture 36. In one embodiment in accordance with the present invention, and as shown in FIGS. 1 and 2, aperture 36 can be encapsulated with a dielectric material 35. Though dielectric material may partially or completely fill aperture 36, thereby encapsulating first and second conductive pathways 34 and 34', this will not impede the signal coupling between the first and second conductive paths 34, 34'. Again, the conductive core 30 can be any conductive material, including but not limited to a conductive metal such as copper that is conductive and thus impedes the signal coupling of differential signals as they traverse the conductive core. Though a polyamide resin is preferred for the dielectric material 35 and the material making up first and second layers 42, 42', the dielectric material 35 and layers 42, 42' can be any non conductive material, including but not limited to epoxy resins, fiber reinforced resins, polymers and the like.

The impedance match and signal coupling between the first and second traces 32, 32' and the first and second conductive paths 34, 34' is illustrated by the electric field distribution lines 40 and 42, as shown in FIG. 2. When traversing a dielectric layer of substrate 31 on a first side of conductive core 30, the impedance between the differential signal first and second traces 32, 32' is matched and the signal coupling is more optimized. This is shown by electric field distribution lines 40 indicating coupling between the signal carried on first trace 32 and the signal carried on the second trace 32'. The same is true when the first and second traces 32, 32' traverse a second layer on the second side of conductive core 30. When traversing conductive core 30 by way of first and second conductive paths 34, 34' spaced apart in aperture 36 the impedance between the differential signals carried by conductive paths 34, 34' generally stays matched. Electric field distribution lines 42 illustrate a more desired signal coupling from the signal carried on the first conductive path 34 and the signal carried on the second conductive path 34'.

By keeping the impedance matched from a first layer on the first side of conductive core 30, through conductive core 30 to a second layer on a second side of conductive core 30, not only maintains a signal integrity, but also maintains the common mode noise assumption. As previously discussed, where differential signal traces are routed close together and have matched impedance, the external noise will be coupled into each signal substantially equally. This allows for the noise to be substantially cancelled out, leaving only the resulting signal. Because the differential signals are in the same environment when traversing the first layer and the second layer, as well as when traversing conductive core 30 by way of the first and second conductive paths 34, 34', noise should be coupled to the signals in substantially equal amounts, and thus the common noise assumption is valid with aperture 36 in conductive core 30.

As illustrated in FIG. 1 and FIG. 2, creation of aperture 36 in conductive core 30 substantially addresses the problem of impedance mismatch and allows common mode noise assumption to hold true. Creation of aperture 36 can be easily and cost effectively accomplished during the substrate manufacturing process. For example, two independent apertures can be created and plated as necessary to enable signal conductivity. A third aperture could then be created between the two independent apertures, effectively removing the portion of conductive core between the two independent apertures. The aperture can be created in a variety of ways, including, but not limited to laser etching, drilling an additional hole, or other known methods. Aperture 36 can also be created in conductive core 30 by creating a single aperture, coating the metal core and aperture with a dielectric material, then creating two conductive paths within the aperture such that the conductive paths are electrically insulated from each other, and such that there is no conductive core between the conductive paths to impede signal coupling. Another example of a single aperture embodiment in accordance with the present invention is shown in FIG. 4, where aperture 36 could be laser etched to a size adapted to sufficiently reduce the impedance causing metal core, where the first and second conductive paths 34, 34' are created at opposite ends of aperture 36.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A conductive core substrate, comprising:
   a first layer and a second layer;
   a conductive core between the first layer and second layer, the conductive core having a first side and an opposite second side, the conductive core further comprising an aperture extending from the first side to the second side; and
   a first trace and a second trace electrically insulated from each other and the conductive core, the first trace and second trace traversing the conductive core through the aperture.

2. The conductive core substrate of claim 1, wherein the aperature further comprises:
   a first conductive path extending from the first side to the second side of the conductive core, the first conductive path being electrically insulated from the conductive core, the first trace being electrically interconnected to the first conductive path; and
   a second conductive path extending from the first side to the second side, the second conductive path being electrically insulated from the conductive core, the second conductive path being electrically insulated from the first conductive path, and the second conductive path being electrically interconnected to the second trace.

3. The conductive core substrate of claim 2, wherein the first conductive path and the second conductive path are plated through holes.

4. The conductive core substrate of claim 1, wherein the conductive core is a metal core.

5. A microelectronic package, comprising:
   a microelectronic device, the micro electronic device further comprising
   a microelectronic die, and
   a substrate, the substrate further comprising a first layer, a second layer, a conductive core between the first layer and second layer, and a first trace and a second trace electrically insulated from each other and the conductive core, the conductive core having a first side and an opposite second side, the conductive core further comprising an aperture extending from the first side to the second side, and the first trace and second trace traversing the conductive core through the aperture.

6. The microelectronic package of claim 5, wherein the aperature further comprises:
   a first conductive path extending from the first side to the second side of the conductive core, the first conductive path being electrically insulated from the conductive core, the first trace being electrically interconnected to the first conductive path; and
   a second conductive path extending from the first side to the second side, the second conductive path being electrically insulated from the conductive core, the second conductive path being electrically insulated from the first conductive path, the second conductive path being electrically interconnected to the second trace.

7. The microelectronic package of claim 6, wherein the first conductive path and the second conductive path are plated through holes.

8. The microelectronic package of claim 5, wherein the conductive core is a metal core.

9. A computing device, comprising:
   a power source;
   at least one microelectronic package, the microelectronic package comprising a microelectronic device, the micro electronic device further comprising
   a microelectronic die, and
   a substrate, the substrate further comprising a first layer, a second layer, a conductive core between the first layer and second layer, and a first trace and a second trace electrically insulated from each other and the conductive core, the conductive core having a first side and an opposite second side, the conductive core further comprising an aperture extending from the first side to the second side, and the first trace and second trace traversing the conductive core through the aperture.

10. The computing device of claim 9, wherein the aperature further comprises:
    a first conductive path extending from the first side to the second side of the conductive core, the first conductive path being electrically insulated from the conductive core, the first trace being electrically interconnected to the first conductive path; and
    a second conductive path extending from the first side to the second side, the second conductive path being electrically insulated from the conductive core, the second conductive path being electrically insulated from the first conductive path, and the second conductive path being electrically interconnected to the second trace.

11. The computing device of claim 10, wherein the first conductive path and the second conductive path are plated through holes.

12. The computing device of claim 9, wherein the conductive core is a metal core.

13. A conductive core substrate, comprising:
    a first differential signal trace adapted to carry a first signal and a second differential signal trace adapted to carry a second differential signal;
    a conductive core having a first side and a second side;
    an aperture in the conductive core extending from the first side to the second side;
    a first conductive path disposed within the aperture and extending through the conductive core, the first conductive path adapted to electrically interconnect to the first differential signal trace to allow the first differential signal to traverse from the first side to the second side of the conductive core; and a second conductive path disposed within the aperture and extending through the conductive core, the second conductive path being electrically insulated from the first conductive path, the second conductive path adapted to electrically interconnect to the second differential signal trace to allow the second differential signal to traverse from the first side to the second side of the conductive core.

14. The conductive core substrate of claim 13, wherein the conductive core is a metal core.

15. The conductive core substrate of claim 13, wherein the first conductive path and the second conductive path are plated through holes.

16. A microelectronic package, comprising:
a microelectronic device, the micro electronic device further comprising
a microelectronic die, and
a substrate, the substrate further comprising a first differential signal trace adapted to carry a first differential signal, a second differential signal trace adapted to carry a second differential signal, a conductive core having a first side and a second side, an aperture in the conductive core extending from the first side to the second side, a first conductive path disposed within the aperture and extending through the conductive core, and a second conductive path disposed within the aperture and extending through the conductive core, the first conductive path adapted to electrically interconnect to the first differential signal trace to allow the first differential signal to traverse from the first side to the second side of the conductive core, and the second conductive path being electrically insulated from the first conductive path, the second conductive path adapted to electrically interconnect to the second differential signal trace to allow the second differential signal to traverse from the first side to the second side of the conductive core.

17. The microelectronic package of claim 16, wherein the conductive core is a metal core.

18. The microelectronic package of claim 16, wherein the first conductive path and the second conductive path are plated through holes.

19. A computing device, comprising:
a power source;
at least one microelectronic package, the microelectronic package comprising a microelectronic device, the micro electronic device further comprising
a microelectronic die, and
a substrate, the substrate further comprising a first differential signal trace adapted to carry a first differential signal, a second differential signal trace adapted to carry a second differential signal, a conductive core having a first side and a second side, an aperture in the conductive core extending from the first side to the second side, a first conductive path disposed within the aperture and extending through the conductive core, and a second conductive path disposed within the aperture and extending through the conductive core, the first conductive path adapted to electrically interconnect to the first differential signal trace to allow the first differential signal to traverse from the first side to the second side of the conductive core, and the second conductive path being electrically insulated from the first conductive path, the second conductive path adapted to electrically interconnect to the second differential signal trace to allow the second differential signal to traverse from the first side to the second side of the conductive core.

20. The computing device of claim 19, wherein the conductive core is a metal core.

21. The computing device of claim 19, wherein the first conductive path and the second conductive path are plated through holes.

* * * * *